United States Patent
Kuo et al.

(10) Patent No.: US 10,483,431 B2
(45) Date of Patent: Nov. 19, 2019

(54) LIGHT SOURCE MODULE AND DISPLAY DEVICE

(71) Applicant: InnoLux Corporation, Miao-Li County (TW)

(72) Inventors: Shu-Ming Kuo, Miao-Li County (TW); Chung-Kuang Wei, Miao-Li County (TW); Chin-Lung Ting, Miao-Li County (TW); Ruey-Jer Weng, Miao-Li County (TW)

(73) Assignee: InnoLux Corporation, Miao-Li County (TW)

( * ) Notice: Subject to any disclaimer, the term of this patent is extended or adjusted under 35 U.S.C. 154(b) by 0 days.

(21) Appl. No.: 15/981,883

(22) Filed: May 16, 2018

(65) Prior Publication Data
US 2018/0351034 A1 Dec. 6, 2018

(30) Foreign Application Priority Data
Jun. 6, 2017 (CN) .......................... 2017 1 0418861

(51) Int. Cl.
| | |
|---|---|
| *H01L 33/06* | (2010.01) |
| *H01L 27/15* | (2006.01) |
| *H01L 33/60* | (2010.01) |
| *H01L 33/52* | (2010.01) |
| *H01L 33/50* | (2010.01) |
| *H01L 25/075* | (2006.01) |
| *H01L 33/58* | (2010.01) |

(52) U.S. Cl.
CPC ............ *H01L 33/06* (2013.01); *H01L 27/156* (2013.01); *H01L 33/507* (2013.01); *H01L 33/52* (2013.01); *H01L 33/60* (2013.01); *H01L 25/0753* (2013.01); *H01L 33/58* (2013.01); *H01L 2933/0083* (2013.01)

(58) Field of Classification Search
CPC ......... H01L 33/06; H01L 33/52; H01L 33/60; H01L 27/156
See application file for complete search history.

(56) References Cited

U.S. PATENT DOCUMENTS

| | | | |
|---|---|---|---|
| 2015/0115221 A1* | 4/2015 | Nagel | H01L 33/44 257/13 |
| 2018/0138359 A1* | 5/2018 | Ulmer | H01L 33/502 |
| 2018/0323352 A1* | 11/2018 | Takano | F21K 9/20 |

* cited by examiner

*Primary Examiner* — Julia Slutsker
(74) *Attorney, Agent, or Firm* — Winston Hsu

(57) ABSTRACT

A light source module includes a quantum dot cell, a light emitting element, and an adhesive layer. The quantum dot cell includes a first glass substrate, a second glass substrate, a quantum dot region, and a reflective sealant disposed between the first glass substrate and the second glass substrate and surrounding the quantum dot region. The light emitting element is disposed at a side of the first glass substrate opposite to the quantum dot region and emits a light with a specific wavelength range. The quantum dot material in the quantum dot region converts the light with the specific wavelength range into another wavelength range. The adhesive layer is disposed at an outer side of the light emitting element for attaching the light emitting element to a surface of the first glass substrate.

16 Claims, 8 Drawing Sheets

LIGHT SOURCE MODULE AND DISPLAY DEVICE

BACKGROUND OF THE DISCLOSURE

1. Field of the Disclosure

The present disclosure relates to a light source module and a display device, and more particularly to a light source module with improved reliability and related display device.

2. Description of the Prior Art

Quantum dot (QD) is a material promoted in the new generation display. The wavelength of the light emitted by the quantum dot material can be modulated within a certain range as required by modifying the size of the quantum dot particles, and the emitting spectrum with narrow full-width at half maximum (FWHM) can be approached by controlling the uniformity of the size of the quantum dot particles properly. As a result, when the quantum dot material is applied to the liquid crystal display (LCD), it shows broader color gamut than the traditional organic light-emitting diode (OLED) display. However, quantum dot material is a kind of nano materials, which has a great specific surface area, and therefore the stability of the quantum dot material is relatively low. The quantum dot material has the characteristics of low thermal resistance, low light resistance, and low moisture/oxygen resistance. Thus, the application of the quantum dot material is limited.

SUMMARY OF THE DISCLOSURE

One of the objectives of the present disclosure is to provide a light source module and a display device to solve the above-mentioned issues.

The present disclosure provides a light source module which includes a quantum dot cell, a light emitting element and an adhesive layer. The quantum dot cell includes a first glass substrate, a second glass substrate, a quantum dot region and a reflective sealant. The second glass substrate is disposed corresponding to the first glass substrate and has a light-emitting surface disposed at a side of the second glass substrate opposite to the first glass substrate. The quantum dot region is disposed between the first glass substrate and the second glass substrate, wherein a quantum dot material is disposed in the quantum dot region. The reflective sealant is disposed between the first glass substrate and the second glass substrate and surrounds the quantum dot region. The reflectivity of the reflective sealant ranges from 30% to 100%. The light emitting element is disposed at a side of the first glass substrate opposite to the quantum dot region, wherein the light emitting element can emit a light with a specific wavelength range (a first wavelength range) which enters the quantum dot region, and the quantum dot material can convert the light with the specific wavelength range into a light with another wavelength range (a second wavelength range). The adhesive layer is disposed at an outer side of the light emitting element for attaching the light emitting element to the surface of the first glass substrate.

In some embodiments, the reflective sealant is doped with high-reflectivity particles or includes high-reflectivity particles. In some other embodiments, the reflective sealant is a white sealant.

The present disclosure further provides a display device which includes a circuit board and a plurality of the above-mentioned light source modules disposed on the surface of the circuit board. Each of the light source modules includes a quantum dot cell, a light emitting element and an adhesive layer, and the quantum dot cell includes a first glass substrate, a second glass substrate, a quantum dot region and reflective sealant, wherein the reflectivity of the reflective sealant ranges from 30% to 100%.

These and other objectives of the present disclosure will no doubt become obvious to those of ordinary skill in the art after reading the following detailed description of the embodiment that is illustrated in the various figures and drawings.

DETAILED DESCRIPTION

Figure 1:
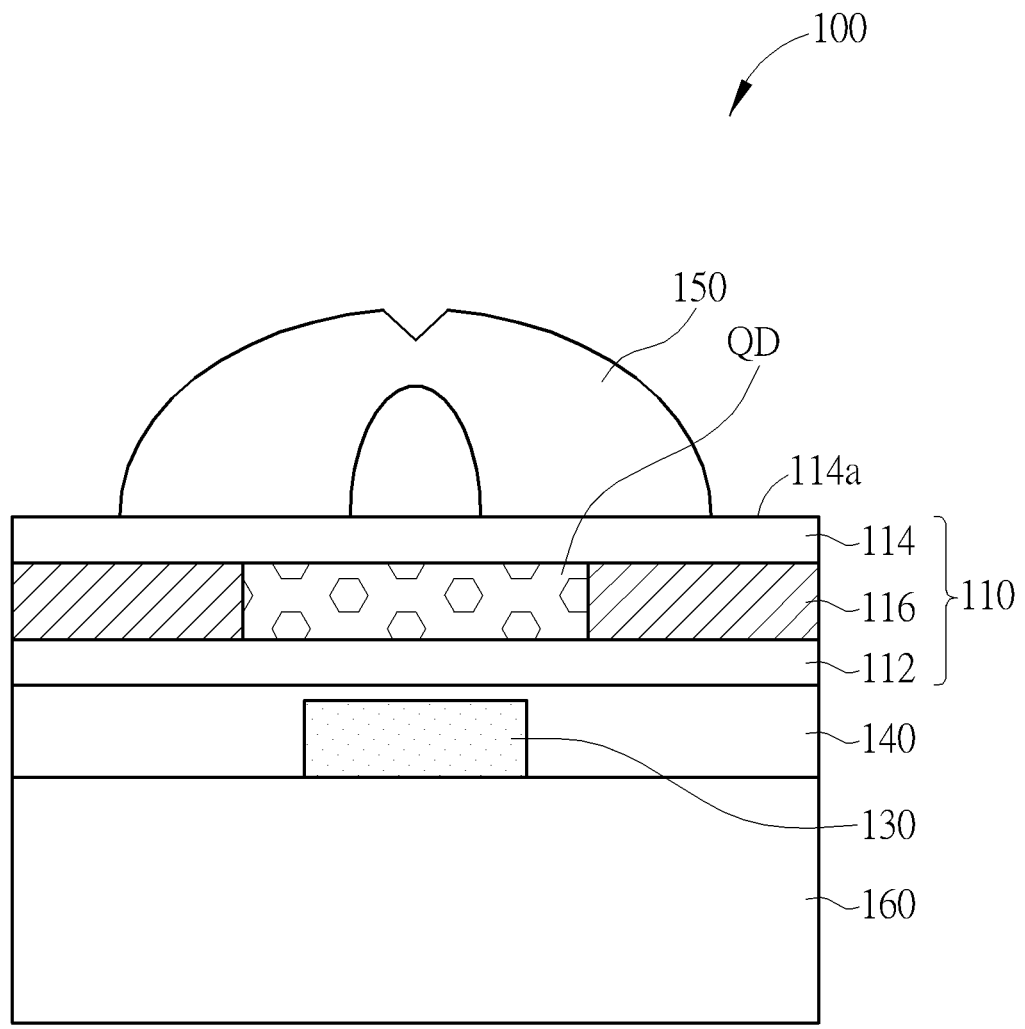
FIG. 1 is a schematic diagram illustrating a cross-sectional view of a light source module according to a first embodiment of the present disclosure.

To provide a better understanding of the present disclosure to those skilled in the art, embodiments will be detailed as follows. The embodiments of the present disclosure are illustrated in the accompanying drawings with numbered elements to elaborate on the contents and effects to be achieved. Please note that the drawings are simplified schematic diagrams and are not intended to limit the present disclosure, and therefore, the drawings show only the components and combinations associated with the present disclosure, so as to provide a clearer description of the basic architecture or method of implementation of the present disclosure. The components would be complex in reality. In addition, for explanation, the components shown in the drawings of the present disclosure are not drawn to the actual number, shape, and dimensions. The detail can be adjusted according to the design requirements.

Figure 2:
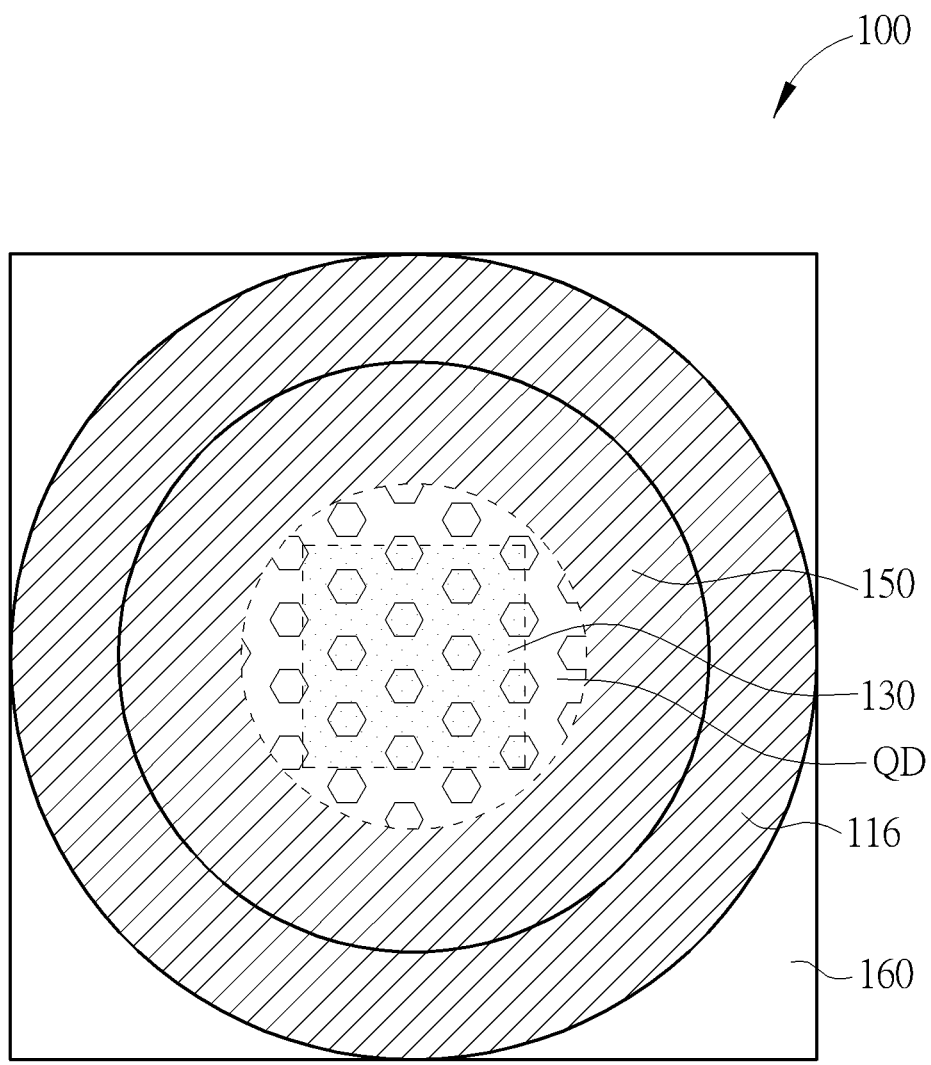
FIG. 2 is a schematic diagram illustrating a top view of a light source module according to the first embodiment of the present disclosure.

Referring to FIG. 1 and FIG. 2, FIG. 1 is a schematic diagram illustrating a cross-sectional view of a light source module according to a first embodiment of the present disclosure, and FIG. 2 is a schematic diagram illustrating a top view of the light source module according to the first embodiment of the present disclosure, wherein some elements of the light source module of the present disclosure are omitted in FIG. 2 in order to simplify the figure. As shown in FIG. 1, the light source module 100 of the first embodiment of the present disclosure includes a quantum dot cell 110, a light emitting element 130 and an adhesive layer 140. The quantum dot cell 110 includes a first glass substrate 112, a second glass substrate 114, a reflective sealant 116 and a quantum dot region QD. The second glass substrate 114 is disposed corresponding to the first glass substrate 112. For example, the second glass substrate 114 and the first glass substrate 112 are disposed in parallel to each other. The second glass substrate 114 has a light-emitting surface 114a at a side of the second glass substrate 114 opposite to the first glass substrate 112. In other words, the light-emitting surface 114a is the upper surface or the outer surface of the second glass substrate 114. The first glass substrate 112 and the second glass substrate 114 may have the characteristics of high moisture resistance and high oxygen moisture resistance. For example, the first glass substrate 112 and the second glass substrate 114 in the present disclosure may be made of a glass substrate respectively. The quantum dot region QD is disposed between the first glass substrate 112 and the second glass substrate 114, and a quantum dot material is disposed in the quantum dot region QD. The reflective sealant 116 is disposed between the first glass substrate 112 and the second glass substrate 114 and surrounds the quantum dot region QD. The reflective sealant 116 has a high reflectivity which ranges from 30% to 100%. In this embodiment, the reflective sealant 116 may include white colloid material (such as the reflective sealant 116 is a white sealant). Alternatively, the reflective sealant 116 may be doped with high-reflectivity particles or include high-reflectivity particles such as titanium dioxide, metals or other proper reflective materials, but not limited thereto. The function of the reflective sealant 116 includes fixing the relative positions of the first glass substrate 112 and the second glass substrate 114 and sealing quantum dot material in the quantum dot region QD between the first glass substrate 112 and the second glass substrate 114 at the same time. Since the reflective sealant 116 has high reflectivity, the light absorbance can be decreased. Accordingly, the lateral light can be reflected back to the quantum dot region QD and hence the light conversion efficiency is increased. Besides, the high reflectivity of the reflective sealant 116 can increase the emitting ratio that light emits out of the light-emitting surface 114a.

The light emitting element 130 of the light source module 100 is disposed at a side of the first glass substrate 112 opposite to the quantum dot region QD. In other words, the light emitting element 130 is disposed at a lower surface of the first glass substrate 112. In this embodiment of the present disclosure, the light emitting element 130 can be, for example, a light-emitting diode (LED) element, wherein the LED element may be disposed in the form of chip or packaging (with lead frame and encapsulation layer for instance). The light emitting element 130 can generate a light with a specific wavelength range (first wavelength range) which will enter the quantum dot region QD, and then the quantum dot material can convert the light with the specific wavelength range (first wavelength range) into a light with another wavelength range (second wavelength range). For example, the light emitting element 130 of this embodiment may be a short-wavelength light source (such as a blue LED or an ultraviolet light source) which produces light with short wavelength (such as blue light), and the quantum dot material can absorb and convert the light with short wavelength into the light with relative long wavelength (such as red light or green light). Hence, the light emitted from the light-emitting surface 114a of the second glass substrate 114 may include blue light, green light and red light, wherein the mix of the three color lights can form a white light to emit out of the light source module 100. In some embodiments, the light emitted from the light-emitting surface 114a may include high ratio of green light or high ratio of red light, but not limited thereto. Furthermore, the adhesive layer 140 is disposed at the outer side of the light emitting element 130 for attaching the light emitting element 130 to a surface of the first glass substrate 112, that is, the adhesive layer 140 is located between the light emitting element 130 and the first glass substrate 112 in a direction parallel to a thickness direction of the first glass substrate. As shown in FIG. 1, the adhesive layer 140 can further be disposed between the light emitting element 130 and the first glass substrate 112, which means the light emitting element 130 is not directly in contact with the first glass substrate 112, so as to fix the light emitting element 130 under the lower surface of the first glass substrate 112 more effectively. In this design, the adhesive layer 140 may fill the gap between the light emitting element 130 and the first glass substrate 112 to mitigate bubbles occurring. According to the present disclosure, the adhesive layer 140 may include transparent glue or a high-reflective glue layer, wherein the high-reflective glue layer may be, for example, a white glue layer or a glue layer doped with high reflective particles. It is noteworthy that when the adhesive layer 140 is a colored glue layer or a white glue layer, the thickness of the adhesive layer 140 between the light emitting element 130 and the quantum dot region QD should be thin enough, such as being less than or equal to 50 .mu.m and greater than or equal to 0 .mu.m, such that the light produced by the light emitting element 130 can enter the first glass substrate 112 and the quantum dot region QD. By such design, the adhesive layer 140 disposed between the light emitting element 130 and the quantum dot region QD can decrease the amount of converted light propagating back into the light emitting element 130 after the light being converted by the quantum dot material, so as to increase the ratio of the converted light emitting out of the light-emitting surface 114a.

The light source device 100 of this embodiment further includes a circuit board 160 disposed at a side of the light emitting element 130 opposite to the first glass substrate 112, wherein the circuit board 160 may be a printed circuit board for instance. In this embodiment, the quantum dot cell 110 is fixed on the surface of the circuit board 160 by the adhesive layer 140, and the circuit included on the surface of the circuit board 160 can serve as the power supply to provide power to the light emitting element 130. In other embodiments, the light emitting element 130 may be fixed on the surface of the circuit board 160 by soldering, but not limited thereto. In variant embodiments, the quantum dot cell 110 or the light emitting element 130 may be fixed on the circuit board 160 by other methods or by multi methods including one or more of the above-mentioned methods. Furthermore, the light source module 100 of this embodiment may selectively include a lens 150 disposed on the light-emitting surface 114a of the second glass substrate 114, wherein the lens 150 may provide light scattering effect to uniform the distribution of the light entering the lens 150 through the light-emitting surface 114a. In variant embodiments, the light source device 100 may have no lens disposed on the second glass substrate 114. According to the present disclosure, the projection area of the reflective sealant 116 on the first glass substrate 112 is about 50% to about 200% of the projection area of the lens 150 on the first glass substrate 112, and the projection area of the quantum dot region QD on the first glass substrate 112 is about 50% to about 500% of the projection area of the emitting area of the light emitting element 130 on the first glass substrate 112.

The quantum dot material of the present disclosure is sealed between the first glass substrate 112 and the second glass substrate 114 with the characteristics of high moisture resistance and high oxygen resistance by the reflective sealant 116, hence the two glass substrates can effectively block oxygen and moisture so as to increase the life time of the quantum dot material. Furthermore, since the quantum dot material is directly disposed above the light emitting element 130 in an adjoining way, it can effectively absorb the blue light and convert the blue light into other color light, such as green light or red light, so as to raise the light conversion efficiency. In addition, the disposition of the lens 150 can increase the ratio of the light with larger viewing angles, which also means increasing various emitting directions of light. Accordingly, the emitting area of the light source module 100 can be increased while the distribution of the emitted light can be uniformed. From the above, the light source module 100 in the present disclosure can allow less usage amount of the quantum dot material but still provide expected illumination with a certain brightness compared to the current quantum dot technology.

The light source module of the present disclosure and related manufacturing method are not limited by the above-described embodiment. Further embodiments or variant embodiments of the present disclosure are described below. To simplify the description, the identical components in each of the following embodiments are marked with identical symbols. For making it easier to compare the difference between the embodiments, the following description will detail the dissimilarities among different embodiments and the identical features will not be redundantly described. The technical features in different embodiments described in the following and the above can be replaced, recombined, or mixed with one another to constitute another embodiment without departing from the spirit of the present disclosure.

Figure 3:
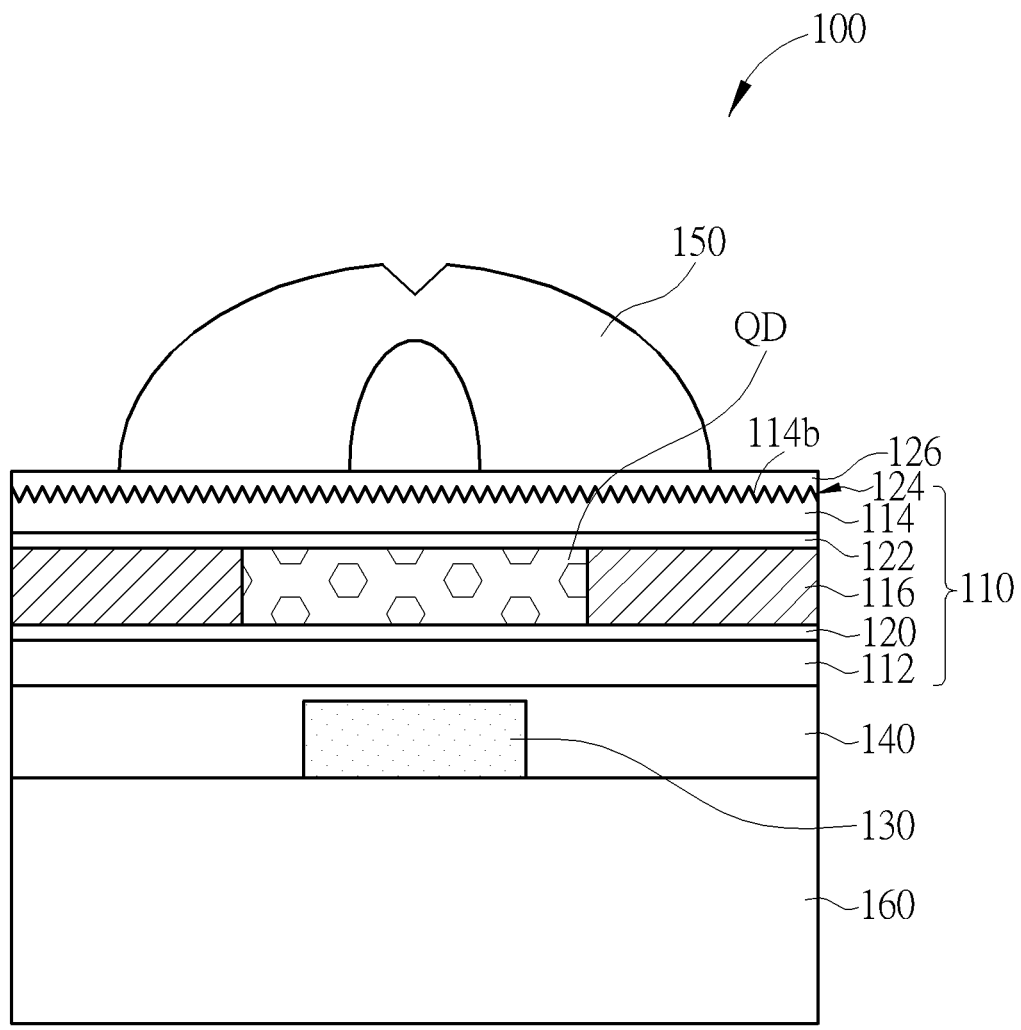
FIG. 3 is a schematic diagram illustrating a cross-sectional view of a light source module according to a second embodiment of the present disclosure.

Referring to FIG. 3, FIG. 3 is a schematic diagram illustrating a cross-sectional view of a light source module according to a second embodiment of the present disclosure. The structure of the light source module 100 of this embodiment is mainly similar to the light source module 100 of the first embodiment, but further includes a selective first optical film 120 and a selective second optical film 122 in order to increase the light conversion efficiency or decrease the usage amount of the quantum dot material. The first optical film 120 may be, but not limited to, a short pass reflector as an example, or any layer or film which can reflect light with long wavelengths but allow light with short wavelengths to pass through. The first optical film 120 is disposed between the first glass substrate 112 and the quantum dot region QD and may have a single layer structure or a multi-layer structure of multiple layers. The first optical film 120 reflects the light with wavelength within a range from a first wavelength to 800 nm and allows the light with wavelength less than the first wavelength to pass through, wherein the first wavelength is defined as a wavelength 20 nm greater than the peak wavelength of the above-mentioned specific wavelength range of the light emitted by the light source device 130. For example, the peak wavelength of the blue light produced by the light source device 130 in this embodiment is about 450 nm, therefore the first wavelength is about 470 nm, and the first optical film 120 can partially reflect the light with wavelength within the range from 470 nm to 800 nm allow the light with wavelength within the range from 200 nm to 470 nm to pass through.

In another aspect, the second optical film 122 may be, for example, a color conversion enhance layer, but not limited thereto. The second optical film 122 may be any film or layer which can reflect the light with short wavelength but allow the light with long wavelength to pass through. The second optical film 122 is disposed between the second glass substrate 114 and the quantum dot region QD and may have a single layer structure or a multi-layer structure, such as having multiple layers. The second optical film 122 reflects light with a wavelength within a range from a second wavelength to 200 nm, wherein the second wavelength is defined as a wavelength 50 nm greater than the peak wavelength of the specific wavelength range of the light produced by the light emitting element 130. As the example mentioned previously, the peak wavelength of the blue light emitted by the light emitting element 130 in this embodiment is about 450 nm, thus the second wavelength is about 500 nm. Accordingly, the second optical film 122 can partially reflect the light with wavelength within the range from 200 nm to 500 nm but allow the light with wavelength within the range from 500 nm to 800 nm to pass through. The light reflected by the second optical layer 122 and the first optical layer 120 can be converted into red light or green light in the quantum dot region QD, thus the light conversion efficiency is increased. The first optical film 120 and the second optical film 122 in this embodiment may be a separate film or layer respectively attached to the surface of the transparent substrate or may be formed by coating or deposition technologies such as physical vapor deposition (PVD) process, but not limited thereto.

The light source module 100 in this embodiment further includes a light scattering layer disposed on the light-emitting surface 114b of the second glass substrate 114. The light scattering layer may include one or more of a roughened microstructure (or a textured microstructure), a prism microstructure, a brightness enhancement film or an optical plating film, which can increase the light emitting ratio of the quantum dot cell 110 and make the light emits out of the quantum dot cell 110 more evenly. The light scattering layer in this embodiment is a roughened microstructure 124 as an example, wherein the roughened microstructure 124 can be formed by roughening the light-emitting surface 114b of the second glass substrate 114, so as to bring one of the following effectives: widening the light emitting angle, increasing the ratio of light with great viewing angles and increasing light emitting directions, but not limited thereto. For example, in other variant embodiments, the roughened microstructure or the prism microstructure may be an optical film which is additional attached onto the light-emitting surface 114b of the second glass substrate 114. Besides, the light scattering layer can be designed as a structure with refractive index gradient, wherein the refractive index is gradually decreased from the side close to the quantum dot region QD to the side close to the light-emitting surface 114b. For example, the refractive index of the side close to the quantum dot region QD may be 1.5, and the refractive index is gradually decreased from 1.5 to 1 toward the side close to the light-emitting surface 114b, but not limited thereto. Furthermore, the light source module 100 of this embodiment may selectively include an anti-reflection layer 126 disposed on the light-emitting surface 114b of the second glass substrate 114, which can improve the color performance and light emitting performance of the light source module 100 and mitigate the affection from ambient light.

Figure 4:
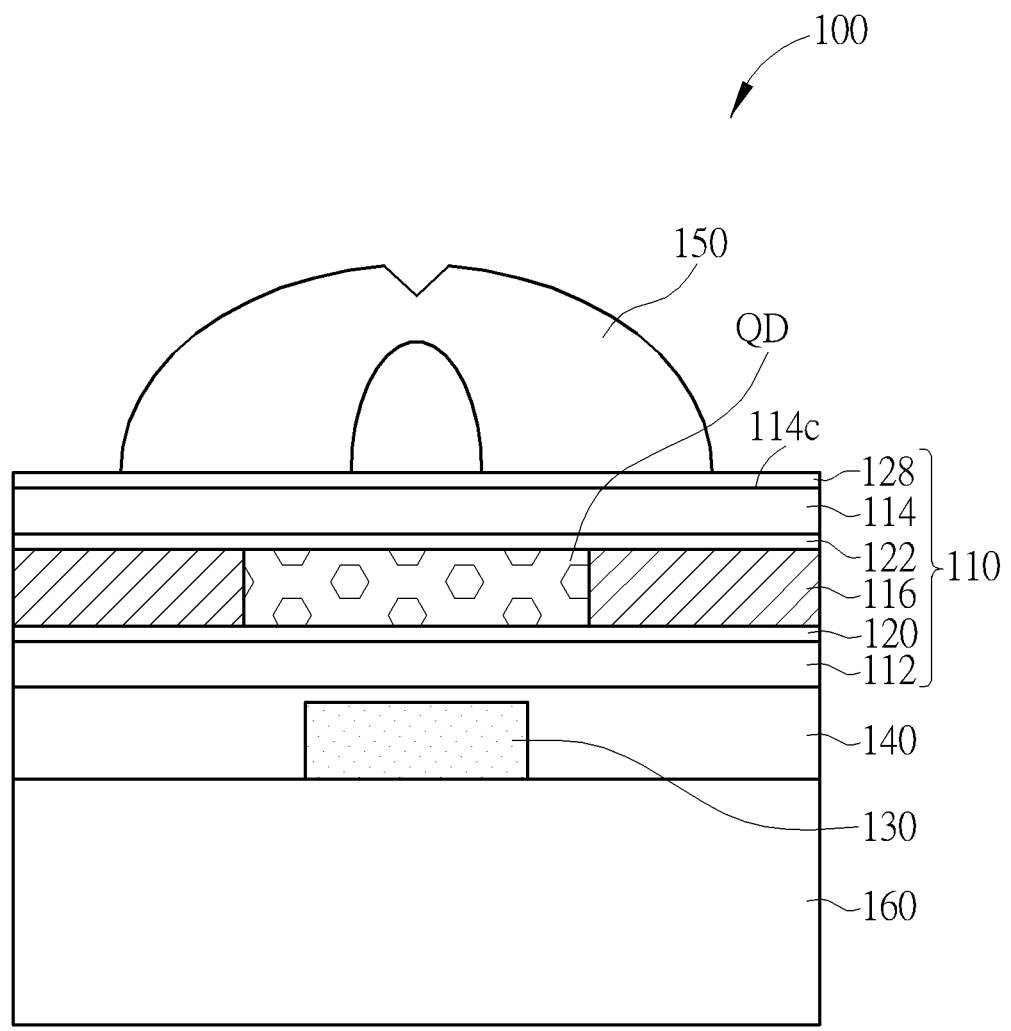
FIG. 4 is a schematic diagram illustrating a cross-sectional view of a light source module in the third embodiment of the present disclosure.

Referring to FIG. 4, FIG. 4 is a schematic diagram illustrating a cross-sectional view of a light source module according to a third embodiment of the present disclosure. The difference between this embodiment and the second embodiment is that an optical plating film 128 is disposed on the light-emitting surface 114c of the second glass substrate 114 to serve as the light scattering layer, which replaces the roughened microstructure 124 in the second embodiment. Besides, there is no anti-reflection layer disposed between the second glass substrate 114 and the lens 150. However, an anti-reflection layer may be disposed between the second glass substrate 114 and the lens 150 in a variant embodiment.

Figure 5:
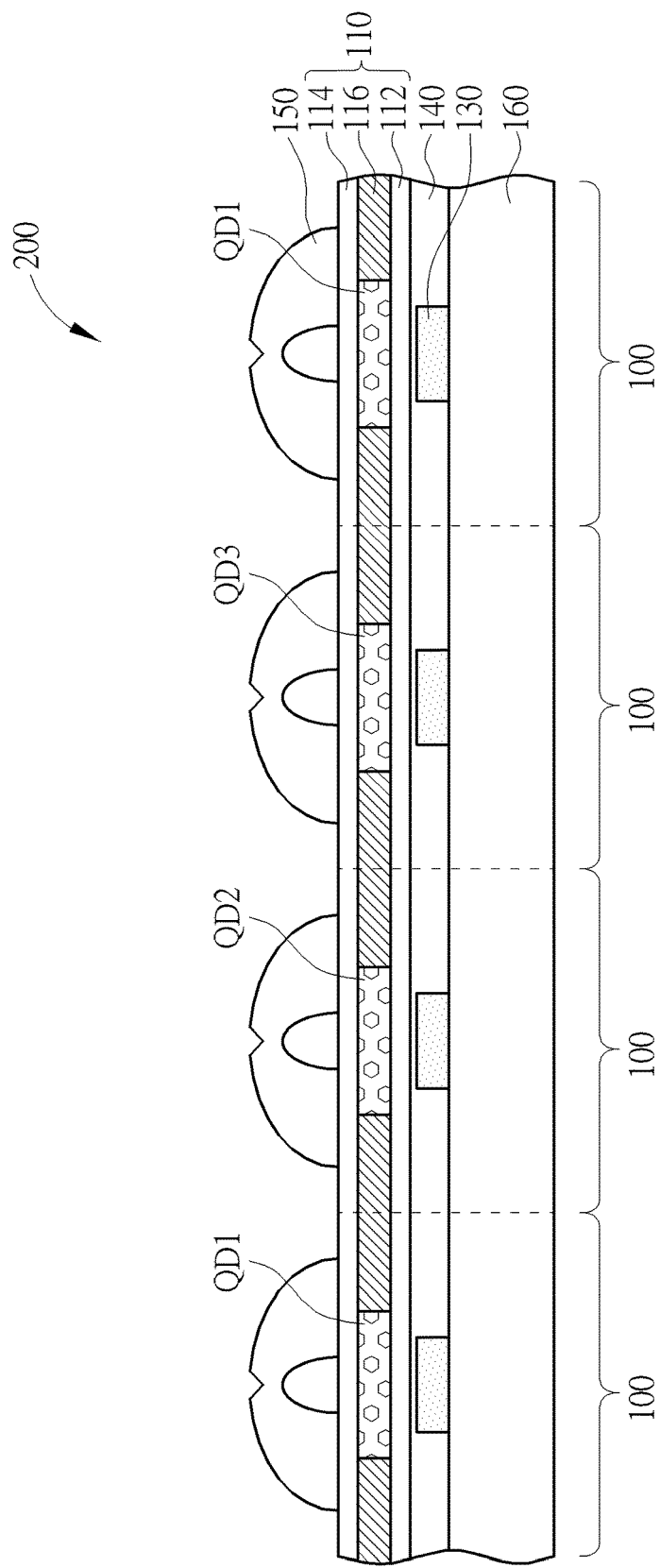
FIG. 5 is a schematic diagram illustrating a cross-sectional view of a display device according to a first embodiment of the present disclosure.

Referring to FIG. 5, FIG. 5 is a schematic diagram illustrating a cross-sectional view of a display device according to a first embodiment of the present disclosure. The display device 200 of this embodiment includes a plurality of light source modules 100 of the present disclosure, wherein the light source modules 100 may be any of the light source module 100 in the above-mentioned embodiments or variant embodiments. The light source modules 100 illustrated in FIG. 5 are the same as the light source module 100 in FIG. 1 as an example. In this embodiment, each of the light source modules 100 includes a quantum dot cell 110, a light emitting element 130 and an adhesive layer 140 disposed on a surface of a common circuit board 160. As mentioned above, one quantum dot cell 110 includes the first glass substrate 112, the second glass substrate 114, the reflective sealant 116 and the quantum dot region QD1, QD2 or QD3. Moreover, the plurality of light source modules 100 share the same first glass substrate 112 and the same second glass substrate 114, which means the first glass substrate 112 and the second glass substrate 114 are common to the plurality of light source modules 100 of the display device 200. In addition, the reflective sealants 116 included in the quantum dot cells 110 of the plurality of light source modules 100 are connected to each other, and the adhesive layers 140 in the plurality of light source modules 100 are connected to each other. In some embodiment, when the light source modules 100 are applied to some other display devices, the lens 150 of the light source modules 100 may be omitted.

The display device 200 in this embodiment is a self-luminous display device. The light emitting elements 130 in the light source modules 100 may be micro light-emitting diode elements or organic light-emitting diode elements for example. The quantum dot materials included in the quantum dot regions QD of the plurality of light source modules 100 may not be completely the same. For example, three adjacent light source modules 100 can include quantum dot materials with different particle sizes, which forms the quantum dot region QD1, the quantum dot region QD2 and the quantum dot region QD3 respectively, so as to convert the light with the specific wavelength range into other lights with different wavelength ranges respectively. For example, the light emitting elements 130 may be ultraviolet light-emitting diodes, and the quantum dot region QD1, the quantum dot QD2 and the quantum dot QD3 can convert the ultraviolet light into red light, green light and blue light respectively, but not limited thereto. Hence, the three adjacent light source modules 100 emit light with different colors. Accordingly, the quantum dot region QD1, the quantum dot QD2 and the quantum dot QD3 can be disposed periodically to form a matrix or an array, so as to show colorful images.

Figure 6:
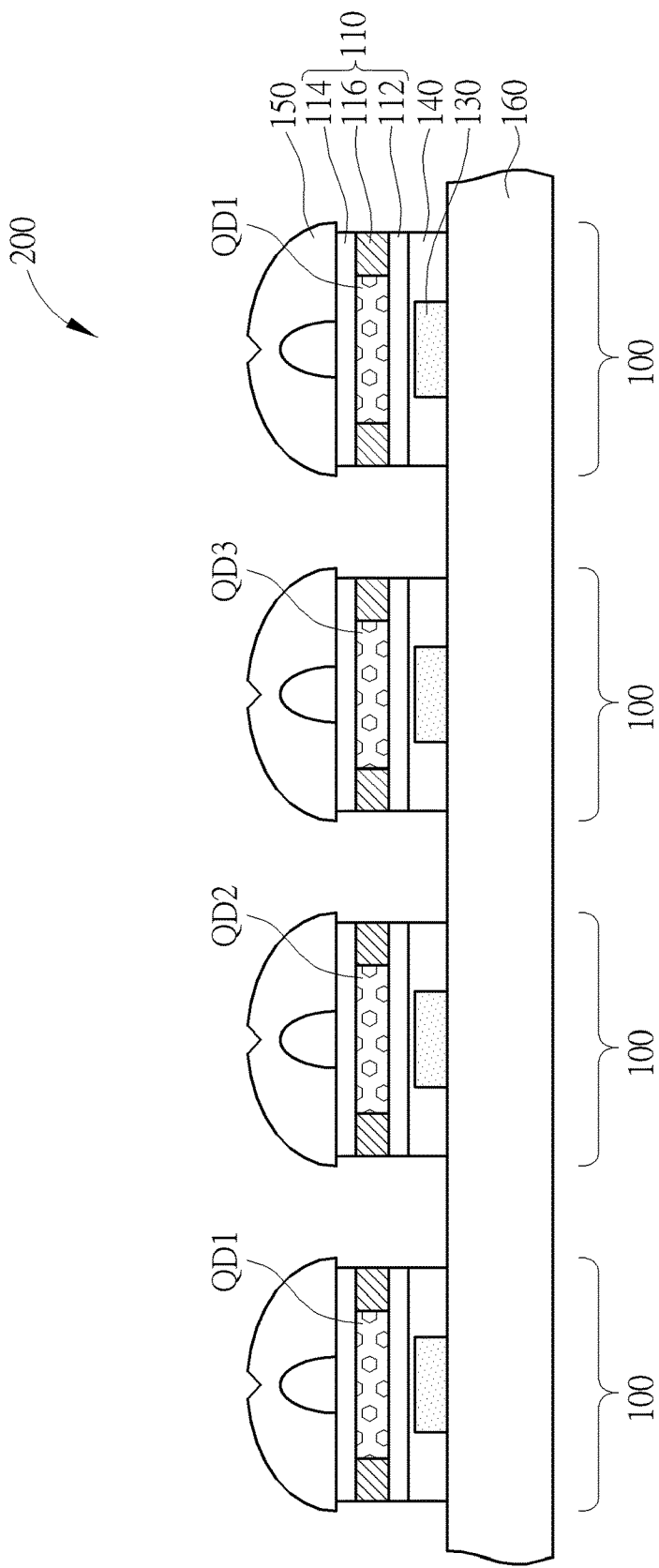
FIG. 6 is a schematic diagram illustrating a cross-sectional view of a display device according to a second embodiment of the present disclosure.

Referring to FIG. 6, FIG. 6 is a schematic diagram illustrating a cross-sectional view of a display device according to a second embodiment of the present disclosure. The main difference between the display device 200 in FIG. 6 and FIG. 5 is that the light source modules 100 in FIG. 6 are separate from each other and are not connect to each other, which means the light source modules 100 in FIG. 6 are spaced apart from each other. In other words, the first glass substrates 112 of the plurality of light source modules 100 are separate from each other or disposed separately and the second glass substrate 114 of the plurality of light source modules are separate from each other or disposed separately. The reflective sealants 116 of the plurality of light source modules 100 are separate and spaced apart from each other, and the adhesive layers 140 of the plurality of the light source modules 100 are separate and spaced apart from each other. In the present disclosure, the projection area of the reflective sealant 116 on the first glass substrate 112 is 50% to 200% of the projection area of the lens 150 on the first glass substrate 112 in one light source module 100, and the projection area of the quantum dot region QD on the first glass substrate 112 is 50% to 500% of the projection area of the emitting area of the light emitting element 130 on the first glass substrate 112, but not limited thereto.

Figure 7:
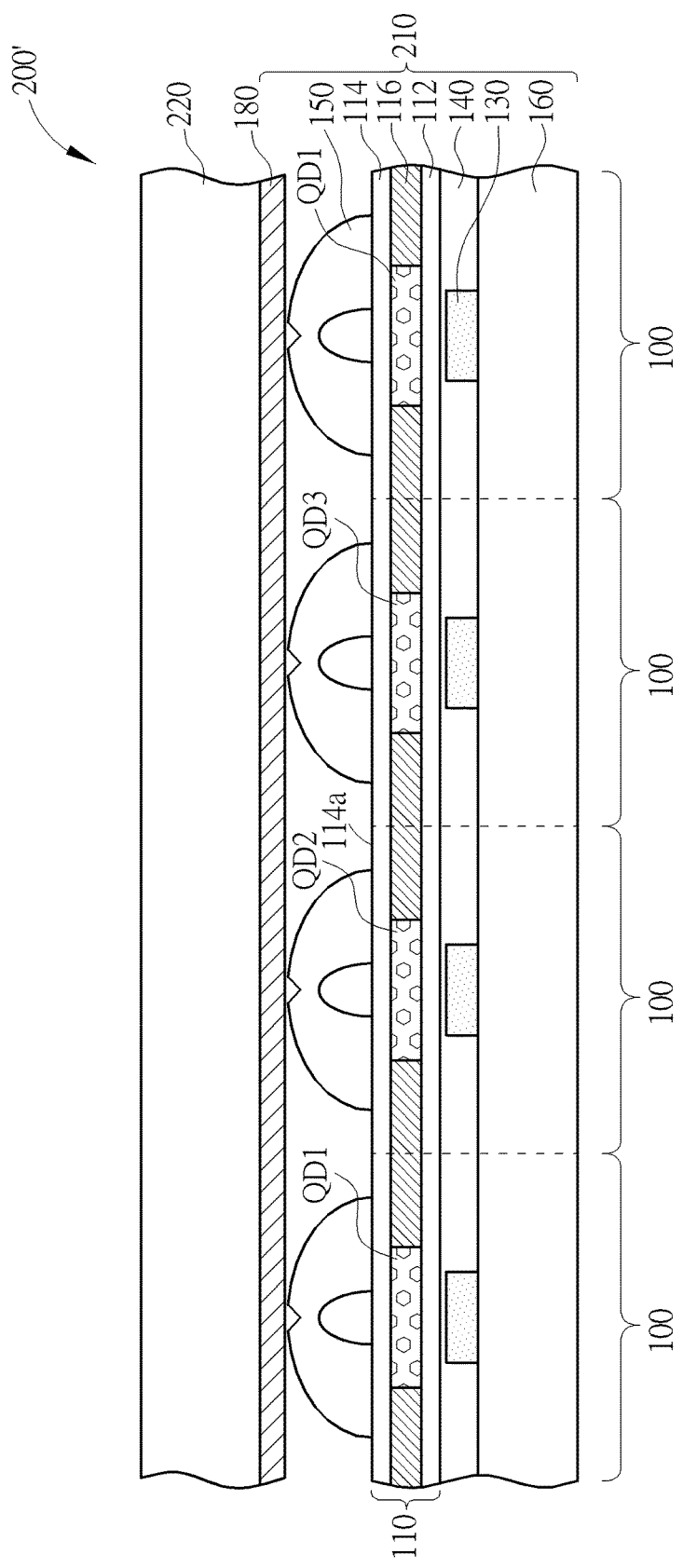
FIG. 7 is a schematic diagram illustrating a cross-sectional view of a display device according to a third embodiment of the present disclosure.

Referring to FIG. 7, FIG. 7 is a schematic diagram illustrating a cross-sectional view of a display device according to a third embodiment of the present disclosure. The display panel 200' in this embodiment includes a plurality of the above-mentioned light source modules 100 and a display panel 220 disposed at the light-emitting side of the light source modules 100. The display panel 220 may be, for example, a non-self-luminous display panel such as a liquid crystal display panel or an electrophoretic display panel, but not limited thereto. The plurality of light source modules 100 in this embodiment share the same first glass substrate 112 and the second glass substrate 114, which means the first glass substrate 112 and the second glass substrate 114 are common to the plurality of light source modules 100. The relative positions of the elements of the structures of the plurality of light source modules 100 of this embodiment may be the same as that shown in FIG. 5, while the structures of the light source modules 100 may be similar to that shown in FIG. 6 in variant embodiments. The display device 200' further includes a diffusion film 180 disposed between the display panel 220 and the light source modules 100. The diffusion film 180 can evenly distribute the light emitted by the backlight source. As a result, a direct-type backlight module 210 is formed with the light source modules 110 and the diffusion film 180 to serve as the backlight source of the display panel 220.

Figure 8:
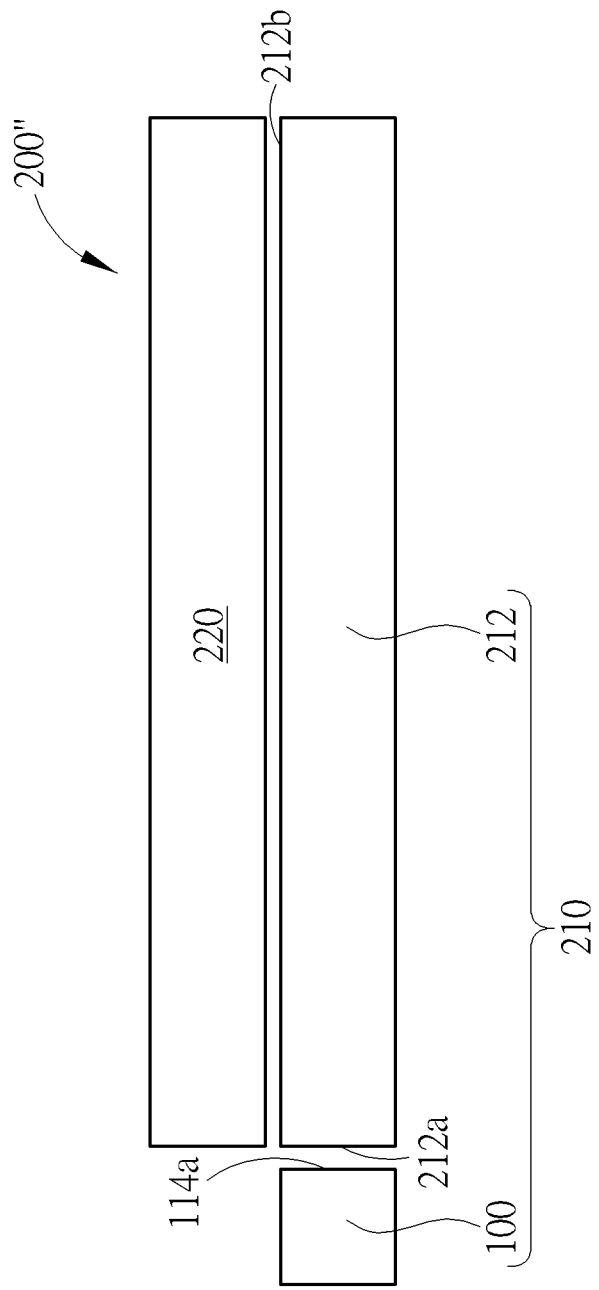
FIG. 8 is a schematic diagram illustrating a cross-sectional view of a display device according to a fourth embodiment of the present disclosure.

Referring to FIG. 8, FIG. 8 is a schematic diagram illustrating a cross-sectional view of a display device according to a fourth embodiment of the present disclosure. The display panel 200" in this embodiment includes a display panel 220 and an edge-type backlight module 210. The edge-type backlight module 210 includes one or more light source modules 100 and a light guide plate 212, wherein one or more of the light source modules 100 may respectively include the structure of the light source module 100 of any of the above-mentioned embodiments. Furthermore, the light guide plate 212 has a light-incident surface 212a and a light-emitting surface 212b connected to the light-incident surface 212a, and the light-incident surfaces 212a of the light guide plate 212 is adjacent to the light-emitting surface(s) 114a of the light source module(s) 100 (such as being adjacent to the light-emitting surface 114a of the second glass substrate 114 shown in FIG. 1). When the backlight module 210 includes plural light source modules 100, the light source modules 100 can be arranged in parallel, wherein the light source modules 100 may either sharing or not sharing the same circuit board, the first glass substrate and the second glass substrate with each other. In other words, the circuit boards, the first glass substrates and the second glass substrates of the light source modules can be either separated or not separated, which means the light source modules 100 may have a common circuit board, a common first glass substrate, and a second glass substrate.

In summary, the quantum dot material of the light source module in the present disclosure is packaged between two transparent substrates with high moisture resistance and high oxygen resistance. For example, the quantum dot material is packaged between the two glass substrates by a reflective sealant to form a quantum dot cell, so as to effectively mitigate life time decreasing due to the invasion of oxygen and moisture. Accordingly, the reliability of the quantum dot cell can be increased. Besides, the quantum dot cell is disposed directly adjacent to the light-emitting side of the light emitting element, and therefore the ratio of light entering the quantum dot region can be raised. By the disposition of the reflective sealant and the adhesive layer that includes high reflectivity material, light can be reflected back to the quantum dot region effectively and thus the light conversion efficiency can be increased. One or more optical films or layers can be selectively disposed on the surface of the transparent substrate of the quantum dot cell, so as to further control the permissible light that can pass through the transparent substrate according to predetermined wavelengths or adjust the emitting angle of the light that emits out of the quantum dot cell. In another aspect, one or more lens can be disposed on the transparent substrate to better uniform the distribution of the emitted light. The display device of the present disclosure may directly include the above-mentioned light source modules to form a self-luminous display. In some situations, the light source modules of the present disclosure can be used as the light source of a direct-type backlight module or an edge-type backlight module of the display device of the present disclosure, so as to provide a backlight with high reliability and uniform light distribution.

Those skilled in the art will readily observe that numerous modifications and alterations of the device and method may be made while retaining the teachings of the disclosure. Therefore, the scope of the present disclosure shall be defined and protected by the following claims and their equivalents.

What is claimed is:

1. A light source module, comprising:
    a quantum dot cell, comprising:
        a first glass substrate;
        a second glass substrate disposed corresponding to the first glass substrate, the second glass substrate having a light-emitting surface disposed at a side of the second glass substrate opposite to the first glass substrate;
        a quantum dot region disposed between the first glass substrate and the second glass substrate, wherein a quantum dot material is disposed in the quantum dot region; and
        a reflective sealant disposed between the first glass substrate and the second glass substrate and surrounding the quantum dot region, a reflectivity of the reflective sealant ranging from 30% to 100%;
    a light emitting element disposed at a side of the first glass substrate opposite to the quantum dot region, wherein the light emitting element emits a light with a first wavelength range, the light enters the quantum dot region, and the quantum dot material converts the light with the first wavelength range into a light with a second wavelength range; and
    an adhesive layer disposed at an outer side of the light emitting element for attaching the light emitting element to a surface of the first glass substrate, wherein the adhesive layer is disposed between the light emitting element and the first glass substrate in a direction parallel to a thickness direction of the first glass substrate.

2. The light source module according to claim 1, wherein the reflective sealant comprises high-reflectivity particles.

3. The light source module according to claim 1, wherein the reflective sealant is a white sealant.

4. The light source module according to claim 1, further comprising a first optical film disposed between the first glass substrate and the quantum dot region, wherein the first optical film reflects light with a wavelength within a range from a first wavelength to 800 nm, and the first wavelength is defined as a wavelength which is 20 nm greater than a peak wavelength of the first wavelength range.

5. The light source module according to claim 1, further comprising a second optical film disposed between the second glass substrate and the quantum dot region, wherein the second optical film reflects light with a wavelength within a range from a second wavelength to 200 nm, and the second wavelength is defined as a wavelength which is 50 nm greater than a peak wavelength of the first wavelength range.

6. The light source module according to claim 1, further comprising:
    a light scattering layer disposed on the light-emitting surface of the second glass substrate, wherein the light scattering layer includes one of a roughened microstructure, a prism microstructure and an optical plating film.

7. The light source module according to claim 6, further comprising:
    an anti-reflection layer disposed on the light-emitting surface of the second glass substrate.

8. The light source module according to claim 1, further comprising:
    a circuit board disposed at a side of the light emitting element opposite to the first glass substrate.

9. The light source module according to claim 1, further comprising a lens disposed on the light-emitting surface of the second glass substrate.

10. The light source module according to claim 9, wherein a projection area of the reflective sealant on the first glass substrate is 50% to 200% of a projection area of the lens on the first glass substrate.

11. The light source module according to claim 1, wherein a projection area of the quantum dot region on the first glass substrate is 50% to 500% of a projection area of an emitting area of the light emitting element on the first glass substrate.

12. A display device, comprising:
    a circuit board; and
    a plurality of light source modules disposed on the circuit board, wherein each of the light source devices comprises:
        a quantum dot cell, comprising:
            a first glass substrate;
            a second glass substrate disposed corresponding and in parallel to the first glass substrate, the second glass substrate having a light-emitting surface at a side of the second glass substrate opposite to the first glass substrate;

a quantum dot region disposed between the first glass substrate and the second glass substrate, wherein a quantum dot material is disposed in the quantum dot region; and a reflective sealant disposed between the first glass substrate and the second glass substrate and surrounding the quantum dot region, wherein a reflectivity of the reflective sealant ranges from 30% to 100%;

a light emitting element disposed at a side of the first glass substrate opposite to the quantum dot region, wherein the light emitting element emits a light with a first wavelength range, the light enters the quantum dot region, and the quantum dot material converts the light with the first wavelength range into a light with a second wavelength range; and an adhesive layer disposed at an outer side of the light emitting element for attaching the light emitting element to a surface of the first glass substrate, wherein the adhesive layer is disposed between the light emitting element and the first glass substrate in a direction parallel to a thickness direction of the first glass substrate.

13. The display device according to claim 12, wherein the first glass substrate and the second glass substrate are common to the plurality of light source modules, the reflective sealants of the plurality of light source modules being connected to each other, and the adhesive layers of the plurality of light source modules being connected to each other.

14. The display device according to claim 12, wherein the first glass substrates and the second glass substrates of the plurality of light source modules are disposed separately, the reflective sealants of the plurality of light source modules being disposed separately, and the adhesive layers of the plurality of light source modules being disposed separately.

15. The display device according to claim 12, wherein in one of the plurality of light source modules, a lens is further disposed on the light-emitting surface of the second glass substrate, and a projection area of the reflective sealant on the first glass substrate is 50% to 200% of a projection area of the lens on the first glass substrate.

16. The display device according to claim 12, wherein a projection area of the quantum dot region on the first glass substrate is 50% to 500% of a projection area of the emitting area of the light emitting element on the first glass substrate.

* * * * *